(12) United States Patent
Pan

(10) Patent No.: US 11,531,384 B1
(45) Date of Patent: Dec. 20, 2022

(54) POWER SUPPLY FOR COMPUTER

(71) Applicant: CHANNEL WELL TECHNOLOGY CO., LTD., Taoyuan (TW)

(72) Inventor: Yi-An Pan, Taoyuan (TW)

(73) Assignee: CHANNEL WELL TECHNOLOGY CO., LTD., Taoyuan (TW)

(*) Notice: Subject to any disclaimer, the term of this patent is extended or adjusted under 35 U.S.C. 154(b) by 0 days.

(21) Appl. No.: 17/460,351

(22) Filed: Aug. 30, 2021

(30) Foreign Application Priority Data

Aug. 5, 2021 (TW) ................................. 110128900

(51) Int. Cl.
*G06F 1/20* (2006.01)
*H05K 7/20* (2006.01)

(52) U.S. Cl.
CPC ........... *G06F 1/20* (2013.01); *H05K 7/20136* (2013.01)

(58) Field of Classification Search
CPC ..... H05K 7/1432; H05K 7/20136; G06F 1/20
See application file for complete search history.

(56) References Cited

U.S. PATENT DOCUMENTS

| | | | |
|---|---|---|---|
| 6,411,514 B1 * | 6/2002 | Hussaini ................ | H05K 7/209 361/689 |
| 2005/0231917 A1 * | 10/2005 | Lin ........................... | G06F 1/26 361/703 |
| 2006/0019596 A1 * | 1/2006 | Su ........................... | G06F 1/206 454/184 |
| 2007/0081306 A1 * | 4/2007 | Wong ........................ | G06F 1/26 361/695 |
| 2008/0117569 A1 * | 5/2008 | Lee ...................... | H05K 7/20172 361/679.48 |
| 2008/0316699 A1 * | 12/2008 | Chen ........................ | G06F 1/18 361/679.41 |
| 2009/0294171 A1 * | 12/2009 | Chen ................... | H05K 5/0013 174/547 |
| 2010/0284149 A1 * | 11/2010 | Su ...................... | H05K 7/20909 361/695 |

(Continued)

FOREIGN PATENT DOCUMENTS

| | | | | |
|---|---|---|---|---|
| CN | 209311983 U | * | 8/2019 | ............... G06F 1/26 |
| DE | 202009002824 U1 | * | 7/2009 | ............... G06F 1/26 |

OTHER PUBLICATIONS

Chen Jing Jiang, "Spannungsversorgungseinheit", Jun. 25, 2009, Entire Document (Translation of DE 202009002824). (Year: 2009).*

(Continued)

*Primary Examiner* — Stephen S Sul

(57) ABSTRACT

A power supply for a computer includes a base having a bottom panel and two end panels being respectively provided with a plurality of first and second fastening sections; a fan assembly having a first frame provided with a plurality of third fastening sections located corresponding to the first fastening sections, and a heat dissipation fan fixed to the first frame; an internal part assembly including a second frame located on the bottom panel and provided with a plurality of fourth fastening sections located corresponding to the second fastening sections, and an internal part unit mounted on the second frame; and a cover being configured complementary to and covered on the base. All the fastening sections are located in a receiving space defined between the base and the cover, and the cover and the bottom panel of the base are free of any fastening holes for fastening purpose.

10 Claims, 2 Drawing Sheets

(56) References Cited

U.S. PATENT DOCUMENTS

| | | | |
|---|---|---|---|
| 2012/0300400 A1* | 11/2012 | Tsai | G06F 1/20 |
| | | | 361/695 |
| 2015/0316968 A1* | 11/2015 | Fan | H02M 3/02 |
| | | | 713/300 |
| 2016/0154445 A1* | 6/2016 | Wu | G06F 1/181 |
| | | | 361/679.48 |
| 2016/0295725 A1* | 10/2016 | Wongjuntra | G06F 1/188 |
| 2019/0166728 A1* | 5/2019 | Minkin | G06F 1/26 |
| 2021/0103321 A1* | 4/2021 | Huang | H02M 7/02 |

OTHER PUBLICATIONS

Shen GuoQIng; Zhang Bin, "High-heat-dissipation computer power supply", Aug. 27, 2019, E Link Tech Co. LTD, Entire Document (Translation of CN 209311983) (Year: 2019).*

* cited by examiner

POWER SUPPLY FOR COMPUTER

CROSS-REFERENCE TO RELATED APPLICATION

This non-provisional application claims priority under 35 U.S.C. § 119(a) on Patent Application No. 110128900 filed in Taiwan, R.O.C. on Aug. 5, 2021, the entire contents of which are hereby incorporated by reference.

BACKGROUND OF THE INVENTION

1. Field of the Invention

The present disclosure relates to a power supply, and more particularly, to a power supply for a computer.

2. Description of the Related Art

A power supply for a computer converts alternating current (AC) to low-voltage and regulated direct current (DC) power for the hard-disk drive, optical disc drive and mother board in a computer.

The conventional computer power supply generally includes an outer case, in which electronic elements such as coils, a circuit board and a heat dissipation fan are mounted. The circuit board and the heat dissipation fan are usually fastened to the outer case using screws. Therefore, there are many fastening screws exposed from the outer case of the computer power supply.

BRIEF SUMMARY OF THE INVENTION

In view that the conventional computer power supply has a plurality of exposed fastening screws that not only adversely affect the evenness of the outer case of the computer power supply, but also produce an excessive frictional force between the slot of the computer case and the computer power supply to prevent the power supply from being smoothly installed in the slot, and that the exposed fastening screws of the conventional computer power supply are visible from outside of a transparent computer case, which is currently very popular, and tend to cause discomfort to some people who are suffering from trypophobia. It is therefore tried by the inventor to develop an improved computer power supply that has smooth outer surface without densely distributed fastening elements.

An objective of the present disclosure is to provide a power supply for a computer. Outer surfaces of the power supply's case contacting with a slot of a case are free of exposed screws, thereby the aforesaid outer surfaces may be even and smooth, so that the power supply for a computer can be smoothly installed in the computer case. Further, the power supply for a computer of the present disclosure that eliminates the exposed fastening elements can be installed in the currently popular transparent computer case without causing discomfort to those suffering from trypophobia.

To achieve at least the above objective, the power supply for a computer according to the present disclosure includes a base, a fan assembly, an internal part assembly and a cover. The base includes a bottom panel and two end panels connected to two opposite ends of the bottom panel. Each of the end panels is provided with a plurality of first fastening sections and a plurality of second fastening sections. The fan assembly includes a first frame located above the bottom panel and a heat dissipation fan fixed to below the first frame. The first frame is provided with a plurality of third fastening sections that is located corresponding to the plurality of first fastening sections. The internal part assembly includes a second frame located on the bottom panel and an internal part unit mounted on the second frame; and the second frame is provided with a plurality of fourth fastening sections that is located corresponding to the plurality of second fastening sections. The cover is configured complementary to and covered on the base, such that all fastened structures formed between the plurality of first fastening sections and the plurality of third fastening sections and all fastened structures formed between the plurality of second fastening sections and the plurality of fourth fastening sections are located in a receiving space defined between the base and the cover and there is not any fastening hole for fastening purpose provided on the cover and the bottom panel of the base.

In an embodiment, the cover includes a top panel located opposite to the bottom panel of the base and two side panels connected to two opposite sides of the top panel. The two side panels are so configured that they are suitable for working with the two end panels to form an enclosed structure.

In an embodiment, the top panel and the two side panels of the cover and the bottom panel of the base are free of any fastening hole for fastening purpose.

In an embodiment, the top panel of the cover is provided with a plurality of heat dissipation holes that are located corresponding to the heat dissipation fan.

In an embodiment, the first frame includes a first frame body. The first frame body has two downward bent sides to serve as the plurality of third fastening sections. The first frame body holds the heat dissipation fan in place and is located between the heat dissipation fan and the top panel. Further, the first frame body is formed with a heat dissipation opening, from which the heat dissipation fan is exposed.

In an embodiment, the power supply for a computer further includes a plurality of fastening elements; and the plurality of third fastening sections are respectively provided at two opposite ends with a hole each, and the plurality of first fastening sections are respectively a fastening hole. The plurality of third fastening sections is fastened to the plurality of first fastening sections by extending the fastening elements through the plurality of third fastening sections into the plurality of first fastening sections.

In an embodiment, the fan assembly includes a plurality of fastening elements, the heat dissipation fan is provided with a plurality of fastening holes, and the first frame body is provided with a plurality of holes. The plurality of holes on the first frame body are fastened to the fastening holes on the heat dissipation fan by extending the fastening elements of the fan assembly through the plurality of holes on the first frame body into the fastening holes on the heat dissipation fan.

In an embodiment, the second frame includes a second frame body, to which the internal part unit is fixed; the plurality of fourth fastening sections are respectively formed at one of four corners of the second frame body; and the second frame body is supported on the bottom panel of the base.

In an embodiment, the power supply for a computer further includes a plurality of fastening elements, the plurality of fourth fastening sections are respectively a hole and the plurality of second fastening sections are respectively a fastening hole. The plurality of fourth fastening sections is fastened to the plurality of second fastening sections by extending the fastening elements through the plurality of fourth fastening sections and into the plurality of second fastening sections.

In an embodiment, each of the two end panels has two vertical edges that are respectively inward bent to form a fastening strip. Each of the fastening strips has one of the plurality of first fastening sections provided near an upper end thereof and one of the plurality of second fastening sections provided near a lower end thereof.

In the power supply for a computer according to the present disclosure, since the fastened structures formed between the base and the fan assembly and the internal part assembly are located in the receiving space defined between the base and the cover, outer surfaces of the power supply for a computer that are to be in contact with the computer case are completely even and smooth to ensure smooth mounting of the power supply for a computer to the computer case. In addition, since the outer surfaces of the power supply for a computer that are visible from outside are smooth without any exposed fastened structure, it is possible to solve the problem that some people would see densely distributed fastening elements and feel discomfort.

DETAILED DESCRIPTION OF THE INVENTION

To facilitate understanding of the objects, characteristics and effects of this present disclosure, embodiments together with the attached drawings for the detailed description of the present disclosure are provided. It is noted the present disclosure can be implemented or applied in other embodiments, and many changes and modifications in the described embodiments can be carried out without departing from the spirit of the disclosure, and it is also understood that the preferred embodiments are only illustrative and not intended to limit the present disclosure in any way.

Figure 1:
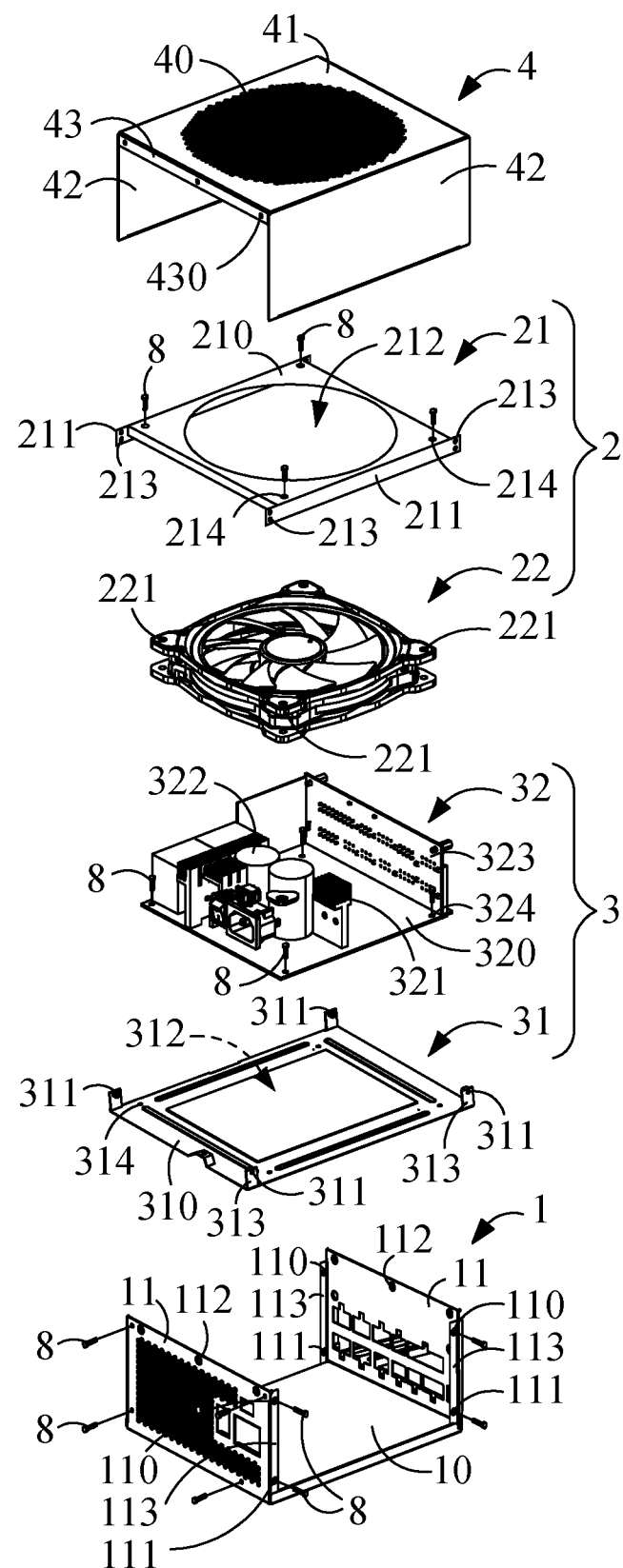
FIG. 1 is an exploded perspective view of a power supply for a computer according to a preferred embodiment of the present disclosure.
Figure 2:
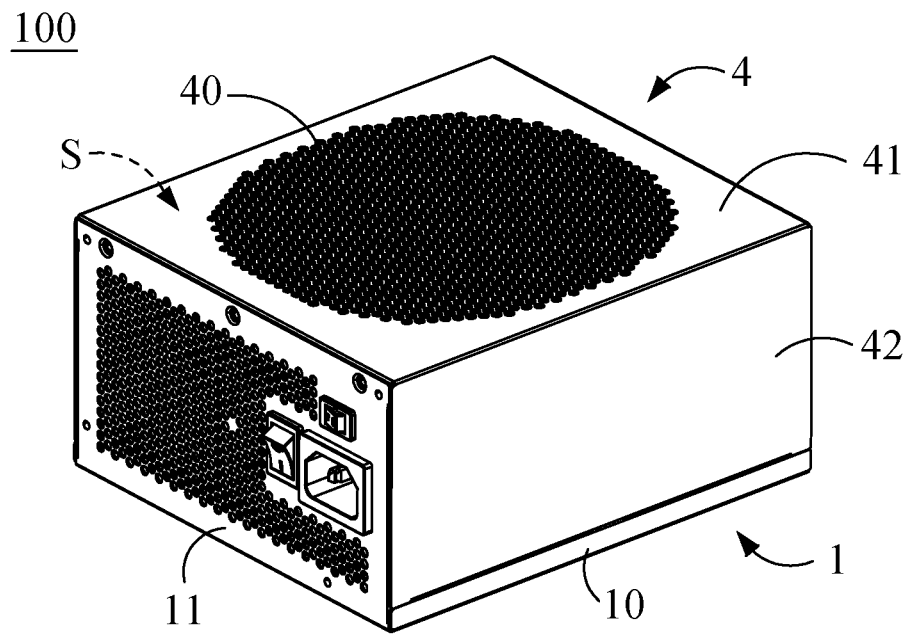
FIG. 2 is an assembled top view of FIG. 1.
Figure 3:
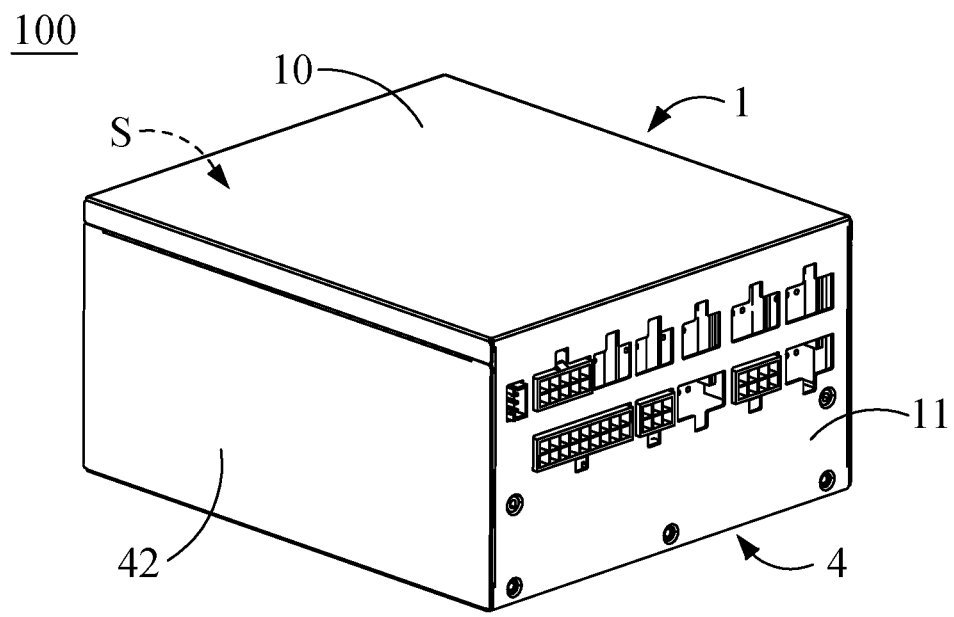
FIG. 3 is an assembled bottom view of FIG. 1.

Please refer to FIGS. 1 to 3. A power supply for a computer according to the present disclosure, which is also briefly referred to as a copmuter power supply and denoted by a reference numeral 100 herein for the purpose of clarity and conciseness, includes a base 1, a fan assembly 2, an internal part assembly 3, and a cover 4. The base 1 includes a bottom panel 10 and two end panels 11 connected to two opposite ends of the bottom panel 10. The end panels 11 are provided with a plurality of first fastening sections 110 and a plurality of second fastening sections 111, respectively. The fan assembly 2 includes a first frame 21 located above the bottom panel 10 and a heat dissipation fan 22 fixed below the first frame 21. The first frame 21 is provided with a plurality of third fastening sections 211 corresponding to the plurality of first fastening sections 110. The internal part assembly 3 includes a second frame 31 located on the bottom panel 10 and an internal part unit 32 mounted on the second frame 31. The second frame 31 is provided with a plurality of fourth fastening sections 313 corresponding to the plurality of second fastening sections 111. The cover 4 is configured complementary to and covered on the base 1. As can be seen in FIGS. 2 and 3, fastened structures formed between the plurality of first fastening sections 110 and the plurality of third fastening sections 211 and fastened structures formed between the plurality of second fastening sections 111 and the plurality of fourth fastening sections 313 are located in a receiving space S defined between the base 1 and the cover 4, such that there is not any fastening hole provided on the cover 4 and the bottom panel 10 of the base 1. In the present disclosure, the term "computer" can be a personal computer, a server or a workstation.

As described above, in the computer power supply 100 according to the present disclosure, since the fastened structures formed between the base 1 and the fan assembly 2 and between the base 1 and the internal part assembly 3 are located in the receiving space S defined between the base 1 and the cover 4, outer surfaces of the computer power supply 100 that are to be in contact with a computer case are completely even and smooth to ensure smooth mounting of the computer power supply 100 to the computer case. In addition, since the outer surfaces of the computer power supply 100 that are visible from outside are smooth without any exposed fastened structure, it is possible to solve the problem that some people would see densely distributed fastening elements and feel discomfort.

As shown in FIG. 1, in the preferred embodiment, the cover 4 includes a top plate 41 corresponding to the bottom panel 10, and two side panels 42 connected to opposite sides of the top plate 41. The two side panels 42 are configured so that they are suitable for working with the two end panels 11 to form an enclosed structure. Since all the fastened structures formed between the base 1 and the fan assembly 2 and the internal part assembly 3 are located in the receiving space S defined between the base 1 and the cover 4, it is not necessary to provide any fastening hole on the top panel 41 and the side panels 42 of the cover 4 and the bottom panel 10 of the base 1. The top panel 41 of the cover 4 is provided with a plurality of heat dissipation holes 40 that are located corresponding to the heat dissipation fan 22. Via the heat dissipation holes 40, cold air and hot air can flow into and out of the computer power supply 100, respectively. The cover 4 includes two downward bent end fastening sections 43 provided at two opposite ends of the top panel 41 (only one is shown in FIG. 1). Each of the two end fastening sections 43 is fitly pressed against an inner side of one of the end panels 11 and has a plurality of fastening holes 430 formed thereon. When the cover 4 is closed onto the base 1, the fastening holes 430 on the end fastening sections 43 are aligned with a plurality of holes 112 formed on the two end panels 11, such that the cover 4 can be fastened to the base 1 with a plurality of fastening elements 8 that extend through the aligned fastening holes 430 and holes 112. The fastening elements 8 can be respectively a screw, and the fastening holes 430 can be respectively an internally threaded hole. However, it is understood the present disclosure is not particularly limited thereto. The fastening elements 8 fastened near lower edges of the two end panels 11 can be further fastened to some parts of the internal part assembly 3, such as electrical connectors, after the internal part assembly 3 is well mounted.

As shown in FIG. 1, in the preferred embodiment, the first frame 21 includes a first frame body 210, which has two downward bent sides to serve as the plurality of third fastening sections 211. The first frame body 210 holds the heat dissipation fan 22 in place and is located between the heat dissipation fan 22 and the top panel 41 of the cover 4. Further, the first frame body 210 is formed with a heat dissipation opening 212, from which the heat dissipation fan 22 is exposed.

As shown in FIG. 1, in the preferred embodiment, each of the two end panels 11 has two vertical edges that are respectively inward bent to form a fastening strip 113. And each of the fastening strips 113 has one of the plurality of first fastening sections 110 provided near an upper end thereof and one of the plurality of second fastening sections 111 provided near a lower end thereof. Each of the third fastening sections 211 is provided at two opposite ends with a hole 213 each. The plurality of first fastening sections 110 can be fastening holes formed near the upper ends of the fastening strips 113; and the plurality of third fastening sections 211 can be separately fastened to the plurality of first fastening sections 110 via a plurality of fastening elements 8 that extend through the plurality of third fastening sections 211 into the plurality of first fastening sections 110. In the preferred embodiment, since there are two end panels 11 that respectively have two fastening strips 113, there are total four fastening strips 113, four first fastening sections 110 and four second fastening sections 111. However, it is understood the present disclosure is not particularly limited thereto.

As shown in FIG. 1, in the preferred embodiment, the heat dissipation fan 22 is provided with a plurality of fastening holes 221, and the first frame body 210 is provided with a plurality of holes 214. The fan assembly 2 further includes a plurality of fastening elements 8 for fastening the plurality of holes 214 to the fastening holes 221. In other operable embodiments, the heat dissipation fan 22 may be fixed to the first frame 21 by bolting, snapping or other ways with or without a tool. In FIG. 1, the heat dissipation fan 22 is provided with four fastening holes 221, but it is understood the present disclosure is not particularly limited thereto. Further, the plurality of holes 214 provided on the first frame body 210 of the first frame 21 can be more in number than the fastening holes 221 provided on the heat dissipation fan 22, such that the first frame 21 is adaptable for differently sized heat dissipation fans 22 and more general for use.

As shown in FIG. 1, in the preferred embodiment, the second frame 31 includes a second frame body 310, to which the internal part unit 32 is fixed. The plurality of fourth fastening sections 313 are respectively formed at one of four corners of the second frame body 310, and the second frame body 310 is supported on the bottom panel 10 of the base 1. The second frame body 310 is formed with a hollowed-out portion 312 to reduce an overall weight of the second frame 31. Since the second frame body 310 is supported on the bottom panel 10 and the internal part unit 32 mounted on the second frame body 310 are also generally supported by the bottom panel 10, the second frame body 310 need only be capable of carrying the internal part unit 32 thereon.

As shown in FIG. 1, in the preferred embodiment, the plurality of fourth fastening sections 313 is respectively provided with a hole 311, and the plurality of second fastening sections 111 are fastening holes formed near lower ends of the fastening strips 113. The plurality of fourth fastening sections 313 can be fastened to the plurality of second fastening sections 111 by extending a plurality of fastening elements 8 through the plurality of holes 311 into the plurality of second fastening sections 111.

As shown in FIG. 1, in the preferred embodiment, the internal part unit 32 includes a circuit board 320 and a plurality of elements mounted on the circuit board 320. The elements include, for example, a heat sink 321, a coil 322, a connecting panel 323 for electrically connecting to power-consuming devices in the computer case, and other necessary elements that are not listed herein. The circuit board 320 is provided with a plurality of holes 324; and the second frame body 310 is provided with a plurality of fastening holes 314 corresponding to the plurality of holes 324. The internal part unit 32 is fastened to the second frame 31 by extending a plurality of fastening elements 8 through the plurality of holes 324 into the fastening holes 314.

While the present disclosure has been described by means of specific embodiments, numerous modifications and variations could be made thereto by those skilled in the art without departing from the scope and spirit of the present disclosure set forth in the claims.

What is claimed is:

1. A power supply for a computer, comprising:
   a base including a bottom panel and two end panels connected to two opposite ends of the bottom panel; and each of the two end panels being provided with a plurality of first fastening sections and a plurality of second fastening sections;
   a fan assembly including a first frame located above the bottom panel and a heat dissipation fan fixed below the first frame; and the first frame being provided with a plurality of third fastening sections that are located corresponding to the plurality of first fastening sections;
   an internal part assembly including a second frame located on the bottom panel and an internal part unit mounted on the second frame; and the second frame being provided with a plurality of fourth fastening sections that are located corresponding to the plurality of second fastening sections; and
   a cover being configured complementary to and covered on the base, such that all fastened structures formed between the plurality of first fastening sections and the plurality of third fastening sections and all fastened structures formed between the plurality of second fastening sections and the plurality of fourth fastening sections are located in a receiving space defined between the base and the cover, and the cover and the bottom panel of the base are free of any fastening hole for fastening purpose.

2. The power supply for the computer according to claim 1, wherein the cover includes a top panel located opposite to the bottom panel of the base and two side panels connected to two opposite sides of the top panel; the two side panels being configured so that they are suitable for working with the two end panels to form an enclosed structure.

3. The power supply for the computer according to claim 2, wherein the top panel and the two side panels of the cover and the bottom panel of the base are free of any fastening hole for fastening purpose.

4. The power supply for the computer according to claim 2, wherein the top panel of the cover is provided with a plurality of heat dissipation holes that are located corresponding to the heat dissipation fan.

5. The power supply for the computer according to claim 1, wherein the first frame includes a first frame body; the first frame body having two downward bent sides to serve as the plurality of third fastening sections; the first frame body holding the heat dissipation fan in place and being located between the heat dissipation fan and the top panel; and the first frame body being formed with a heat dissipation opening, from which the heat dissipation fan is exposed.

6. The power supply for the computer according to claim 5, further comprising a plurality of fastening elements; and wherein the plurality of third fastening sections are respectively provided at two opposite ends with a hole each, and the plurality of first fastening sections are respectively a fastening hole; and the plurality of third fastening sections being fastened to the plurality of first fastening sections by the plurality of fastening elements that extend through the plurality of third fastening sections and into the plurality of first fastening sections.

7. The power supply for the computer according to claim 5, wherein the fan assembly includes a plurality of fastening elements, the heat dissipation fan is provided with a plurality of fastening holes, and the first frame body is provided with a plurality of holes; and the plurality of holes on the first frame body being fastened to the plurality of fastening holes on the heat dissipation fan by extending the plurality of fastening elements of the fan assembly through the plurality of holes on the first frame body into the plurality of fastening holes on the heat dissipation fan.

8. The power supply for the computer according to claim 1, wherein the second frame includes a second frame body, to which the internal part unit is fixed; the plurality of fourth fastening sections being respectively formed at one of four corners of the second frame body, and the second frame body being supported on the bottom panel of the base.

9. The power supply for the computer according to claim 8, further comprising a plurality of fastening elements; and wherein the plurality of fourth fastening sections are each respectively a hole and the plurality of second fastening sections are each respectively a fastening hole; and the plurality of fourth fastening sections being fastened to the plurality of second fastening sections by the fastening elements that extend through the plurality of fourth fastening sections and into the plurality of second fastening sections.

10. The power supply for the computer according to claim 1, wherein each of the two end panels has two vertical edges that are respectively inward bent to form a fastening strip; and each of the fastening strips having one of the plurality of first fastening sections provided near an upper end thereof and one of the plurality of second fastening sections provided near a lower end thereof.

\* \* \* \* \*